(12) United States Patent
Jeong

(10) Patent No.: US 9,935,641 B2
(45) Date of Patent: Apr. 3, 2018

(54) SIGNAL RECOVERY CIRCUIT

(71) Applicant: SK hynix Inc., Icheon-si, Gyeonggi-do (KR)

(72) Inventor: Ha Jun Jeong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/223,057

(22) Filed: Jul. 29, 2016

(65) Prior Publication Data
US 2017/0250696 A1    Aug. 31, 2017

(30) Foreign Application Priority Data

Feb. 26, 2016  (KR) .................. 10-2016-0023565

(51) Int. Cl.
*H03L 7/00* (2006.01)
*H03L 7/24* (2006.01)
*G06F 1/04* (2006.01)
*H03K 5/01* (2006.01)
*H03K 5/1534* (2006.01)
*H03K 5/00* (2006.01)

(52) U.S. Cl.
CPC .................. *H03L 7/24* (2013.01); *G06F 1/04* (2013.01); *H03K 5/01* (2013.01); *H03K 5/1534* (2013.01); *H03K 2005/00019* (2013.01)

(58) Field of Classification Search
CPC .. H03L 7/24; G06F 1/04; H03K 3/037; H03K 5/01; H03K 2005/00019
See application file for complete search history.

(56) References Cited

U.S. PATENT DOCUMENTS

| 5,182,521 A * | 1/1993 | Chang | G06G 7/1865 327/553 |
| 5,381,181 A * | 1/1995 | Deiss | H03L 7/085 348/423.1 |
| 5,479,451 A * | 12/1995 | Eldering | H04L 7/042 375/343 |
| 5,784,379 A * | 7/1998 | Tan | H04J 3/0632 370/395.62 |
| 5,914,996 A * | 6/1999 | Huang | H03K 21/08 327/115 |
| 6,111,448 A * | 8/2000 | Shibayama | G06F 1/10 327/291 |
| 6,285,722 B1 * | 9/2001 | Banwell | H04L 7/027 327/165 |
| 7,096,433 B2 * | 8/2006 | Tschanz | G06F 17/5045 716/120 |
| 8,094,507 B2 * | 1/2012 | Morgan | G11C 7/1078 365/194 |
| 9,020,086 B2 * | 4/2015 | Chen | H03L 7/085 327/147 |

FOREIGN PATENT DOCUMENTS

KR   1020050055228 A   6/2005
KR      101163048 B1   6/2012

\* cited by examiner

*Primary Examiner* — Kenneth B Wells
(74) *Attorney, Agent, or Firm* — William Park & Associates Ltd.

(57) ABSTRACT

A signal recovery circuit includes a clock code generation circuit configured to generate codes in response to an enable signal and a clock, and a pulse recovery circuit configured to generate an output pulse in response to an input pulse and the codes.

18 Claims, 5 Drawing Sheets

SIGNAL RECOVERY CIRCUIT

CROSS-REFERENCES TO RELATED APPLICATION

The present application claims priority under 35 U.S.C. § 119(a) to Korean application number 10-2016-0023565, filed on Feb. 26, 2016, in the Korean Intellectual Property Office, which is incorporated herein by reference in its entirety.

BACKGROUND

1. Technical Field

Various embodiments generally relate to a semiconductor integrated circuit, and, more particularly, to a pulse recovery circuit.

2. Related Art

As a semiconductor integrated circuit trends toward a high speed operation, the semiconductor integrated circuit is configured to operate in synchronization with a clock.

A semiconductor integrated circuit is configured to receive and output signals synchronized with a clock.

Internal circuits constructing the semiconductor integrated circuit are also configured to operate in synchronization with the clock and transmit/receive signals synchronized with the clock to/from one another.

SUMMARY

In an embodiment, a signal recovery circuit may include a clock code generation circuit configured to generate codes in response to an enable signal and a clock, and a pulse recovery circuit configured to generate an output pulse in response to an input pulse and the codes.

In an embodiment, a signal recovery circuit may include a clock code generation circuit configured to generate codes which have a code value corresponding to a predetermined cycle of a clock, when an enable signal is enabled. The signal recovery circuit may also include a pulse recovery circuit configured to enable an output pulse when an input pulse is inputted, and generate the output pulse which has an enable period corresponding to the code value of the codes.

DETAILED DESCRIPTION

Hereinafter, a signal recovery circuit will be described below with reference to the accompanying drawings through various examples of embodiments.

Figure 1:
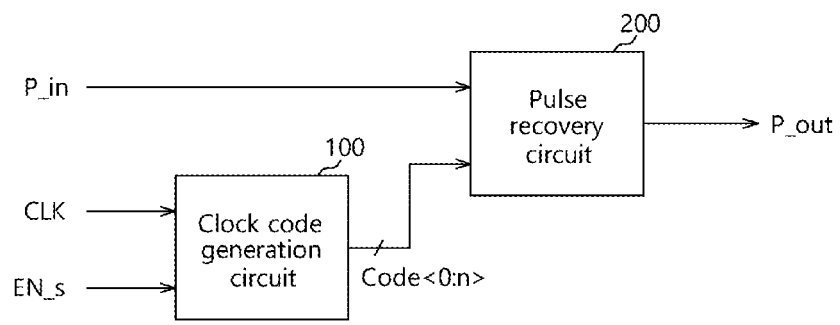
FIG. 1 is a configuration diagram illustrating a representation of an example of a signal recovery circuit in accordance with an embodiment.

As shown in FIG. 1, a signal recovery circuit in accordance with an embodiment may include a clock code generation circuit 100 and a pulse recovery circuit 200.

The clock code generation circuit 100 may generate codes Code<0:n> in response to an enable signal EN_s and a clock CLK. For example, the clock code generation circuit 100 may sense a cycle of the clock CLK in response to the enable signal EN_s, and generate the codes Code<0:n> in response to a sensing result. In detail, the clock code generation circuit 100 may generate the codes Code<0:n> having a code value corresponding to one cycle of the clock CLK, when the enable signal EN_s is enabled.

The pulse recovery circuit 200 may generate an output signal P_out in response to an input signal P_in and the codes Code<0:n>. The input signal P_in and the output signal P_out may be signals which have enable periods of a predetermined length. Therefore, hereinbelow, the input signal P_in and the output signal P_out will be referred to as an input pulse P_in and an output pulse P_out, respectively.

For example, the pulse recovery circuit 200 generates the output pulse P_out in response to the input pulse P_in, and the enable period of the output pulse P_out has a length corresponding to the code value of the codes Code<0:n>.

In detail, the pulse recovery circuit 200 enables the output pulse P_out when the input pulse P_in is at least one of inputted and enabled, and retains the enable period of the output pulse P_out for a time corresponding to the code value of the codes Code<0:n>.

Figure 2:
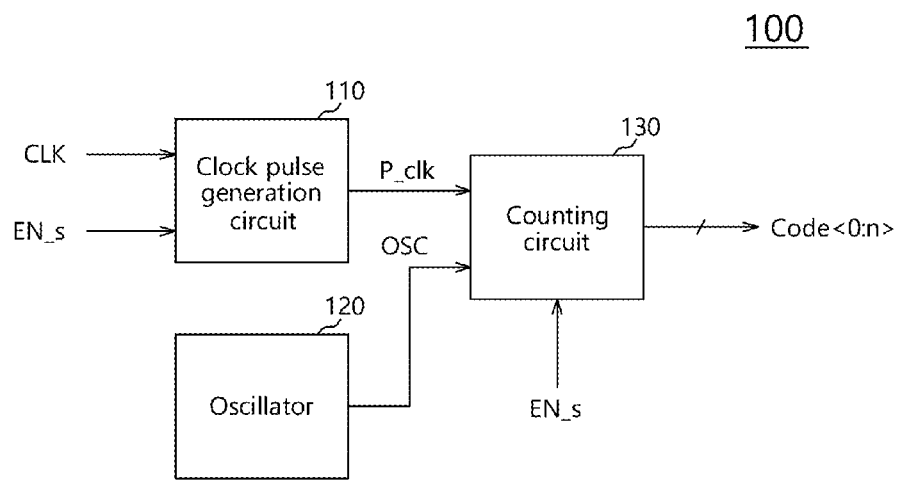
FIG. 2 is a configuration diagram illustrating a representation of an example of a clock code generation circuit shown in FIG. 1.

As shown in FIG. 2, the clock code generation circuit 100 may include a clock pulse generation circuit 110, an oscillator 120, and a counting circuit 130.

The clock pulse generation circuit 110 may generate a clock pulse P_clk in response to the clock CLK and the enable signal EN_s. For example, the clock pulse generation circuit 110 may generate the clock pulse P_clk, which has an enable period the same length as a predetermined cycle of the clock CLK, when the enable signal EN_s is enabled. In detail, the clock pulse generation circuit 110 may generate the clock pulse P_clk, which has the enable period the same length as one cycle of the clock CLK, when the enable signal EN_s is enabled. Therefore, the clock pulse generation circuit 110 may generate the clock pulse P_clk which has an enable period of a length corresponding to the frequency or cycle of the clock CLK, when the enable signal EN_s is enabled.

The oscillator 120 may be configured to generate an oscillator signal OSC which transitions with a preselected cycle.

The counting circuit 130 may generate the codes Code<0:n> in response to the clock pulse P_clk and the oscillator signal OSC. For example, the counting circuit 130 may generate the codes Code<0:n> by counting the oscillator signal OSC during the enable period of the clock pulse P_clk. In detail, the counting circuit 130 may be configured to increase the code value of the codes Code<0:n> each time the oscillator signal OSC transitions to a specified level, during the enable period of the clock pulse P_clk.

Accordingly, the clock code generation circuit 100 in accordance with an embodiment, including the clock pulse generation circuit 110, the oscillator 120, and the counting circuit 130, may generate the codes Code<0:n> which have a code value corresponding to a predetermined cycle of the clock CLK, for example, one cycle of the clock CLK, when the enable signal EN_s is enabled. That is to say, the clock code generation circuit 100 may generate the codes Code<0:n> having a code value corresponding to the cycle or frequency of the clock CLK.

Figure 3:
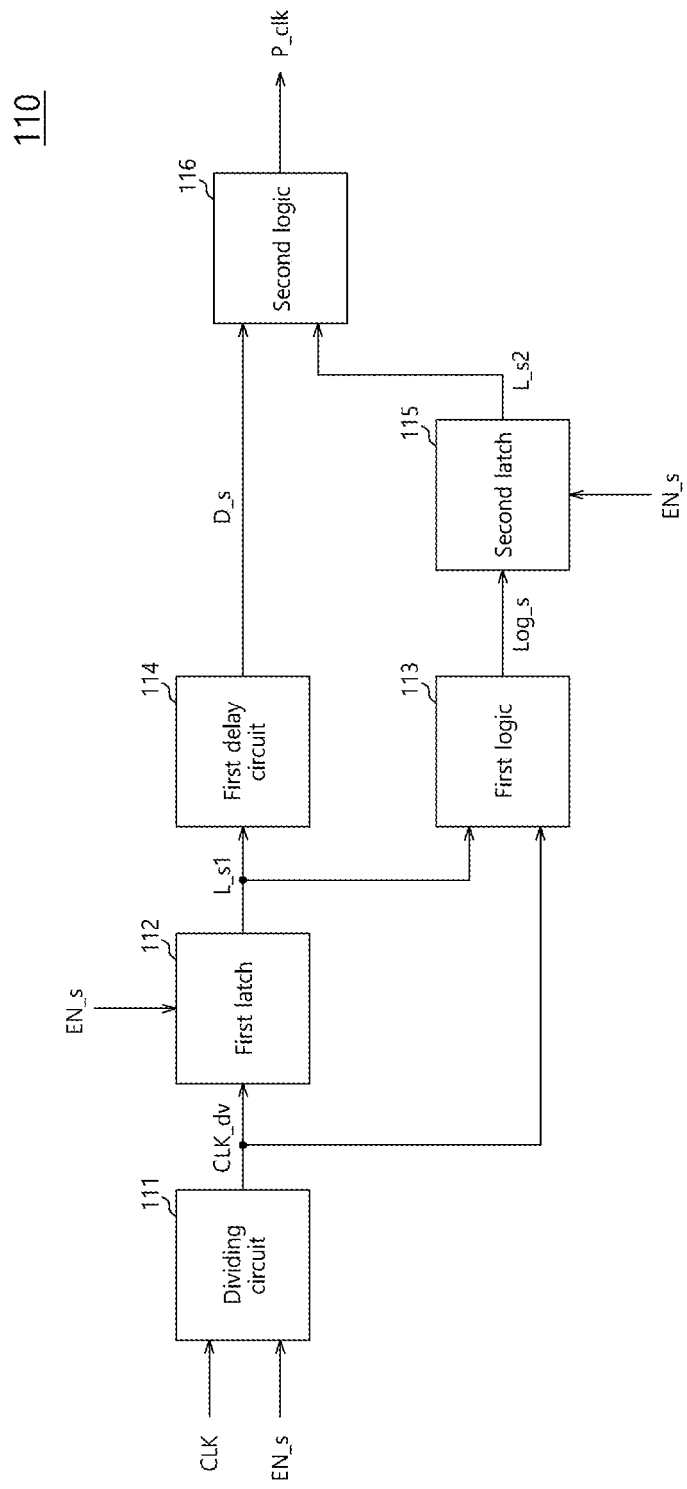
FIG. 3 is a configuration diagram illustrating a representation of an example of a clock pulse generation circuit shown in FIG. 2.

As shown in FIG. 3, the clock pulse generation circuit 110 may include a dividing circuit 111, a first latch 112, a first logic 113, a first delay circuit 114, a second latch 115, and a second logic 116.

The dividing circuit 111 may divide the clock CLK when the enable signal EN_s is enabled, and generate a divided clock CLK_dv. For example, the dividing circuit 111 may divide the clock CLK by 2, and generate the divided clock CLK_dv.

The first latch 112 may generate a first latch signal L_s1 in response to the divided clock CLK_dv and the enable signal EN_s. For example, with the enable signal EN_s enabled, the first latch 112 may enable the first latch signal L_s1 to a high level when the divided clock CLK_dv transitions to a specified level, that is, a high level. The first latch 112 retains the first latch signal L_s1 transitioned to the high level, until the enable signal EN_s is disabled. In other words, the first latch 112 initializes the first latch signal L_s1 to a low level when the enable signal EN_s is disabled.

The first logic 113 may generate a logic signal Log_s in response to the divided clock CLK_dv and the first latch signal L_s1. For example, the first logic 113 may generate the logic signal Log_s having a low level when the divided clock CLK_dv and the first latch signal L_s1 are the same level. The first logic 113 may generate the logic signal Log_s having a high level when the divided clock CLK_dv and the first latch signal L_s1 are different levels.

The first delay circuit 114 may delay the first latch signal L_s1 and generate a delayed signal D_s. The first delay circuit 114 may be configured to have the same delay time as the sum of the delay times of the first logic 113 and the second latch 115.

The second latch 115 may generate a second latch signal L_s2 in response to the logic signal Log_s and the enable signal EN_s. For example, the second latch 115 may enable the second latch signal L_s2 to a high level, when the logic signal Log_s transitions to a specified level, that is, the high level, in the state in which the enable signal EN_s is enabled. The second latch 115 may retain the second latch signal L_s2 transitioned to the high level, until the enable signal EN_s is disabled. In other words, the second latch 115 initializes the second latch signal L_s2 to a low level when the enable signal EN_s is disabled.

The second logic 116 may generate the clock pulse P_clk in response to the delayed signal D_s and the second latch signal L_s2. For example, the second logic 113 may generate the clock pulse P_clk of a low level when the delayed signal D_s and the second latch signal L_s2 are the same level, and the second logic 116 may generate the clock pulse P_clk of a high level when the delayed signal D_s and the second latch signal L_s2 are different levels.

The first and second logics 113 and 116 may be configured in the same manner except that input and output signals thereof are different. Thus, the following descriptions for configuration of the first logic 113 substantially apply for configuration of the second logic 116.

Figure 4:
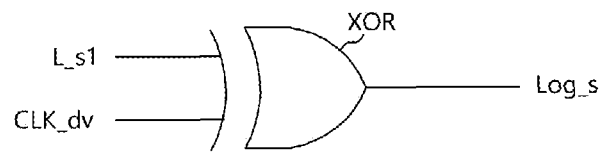
FIG. 4 is a configuration diagram illustrating a representation of an example of a first logic shown in FIG. 3.

As shown in FIG. 4, the first logic 113 may include an exclusive OR gate XOR. The exclusive OR gate XOR is inputted with the first latch signal L_s1 and the divided clock CLK_dv, and outputs the logic signal Log_s.

Figure 5:
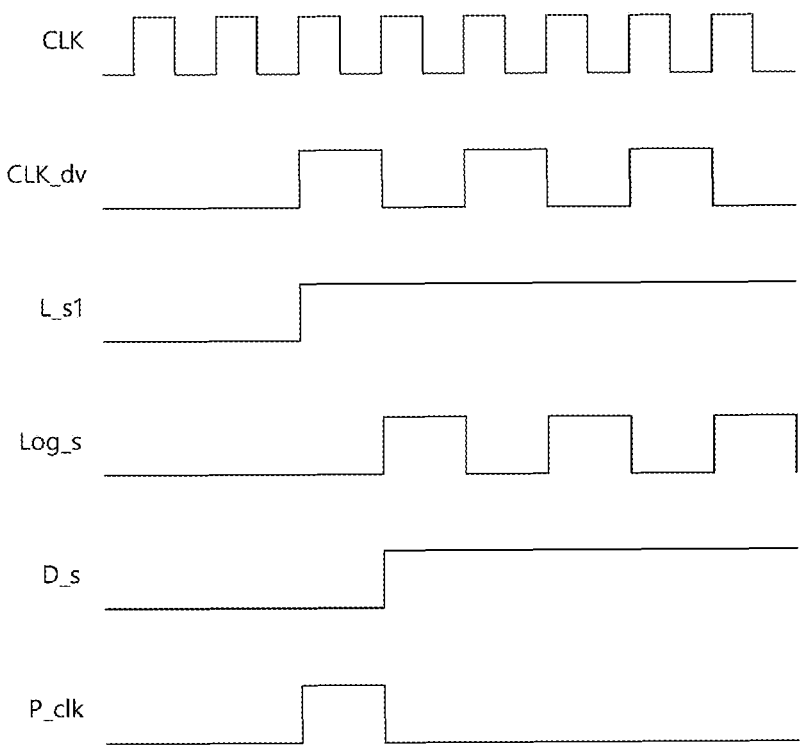
FIG. 5 is a representation of an example of a timing diagram to assist in the explanation of the operation of the clock pulse generation circuit in accordance with the embodiment.

The operation of the clock pulse generation circuit 110 in accordance with an embodiment, configured as mentioned above, will be described below with reference to FIG. 5.

The clock CLK is a signal which transitions cyclically.

The divided clock CLK_dv is a clock which is acquired by dividing the clock CLK by 2. The divided clock CLK_dv is outputted as a clock which transitions to a different level, each time the clock CLK transitions to a high level.

After the enable signal EN_s is enabled, when the divided clock CLK_dv transitions to the high level, the first latch 112 transitions the first latch signal L_s1 to the high level.

The first logic 113 generates the logic signal Log_s having the low level when the first latch signal L_s1 and the divided clock CLK_dv are the same level, and the first logic 113 generates the logic signal Log_s having the high level when the first latch signal L_s1 and the divided clock CLK_dv are different levels. Therefore, the first logic 113 generates the logic signal Log_s having the low level when the first latch signal L_s1 is the low level and the divided clock CLK_dv is the low level, or the first logic 113 generates the logic signal Log_s having the low level when the first latch signal L_s1 is the high level and the divided clock CLK_dv is the high level. Also, the first logic 113 generates the logic signal Log_s having the high level when the first latch signal L_s1 and the divided clock CLK_dv are different levels. Thus, the logic signal Log_s is outputted as the inverted divided clock CLK_dv when the first latch signal L_s1 is the high level. As a result, the logic signal Log_s is outputted as a signal which is acquired by delaying the divided clock CLK_dv by one half cycle.

After the enable signal EN_s is enabled, when the logic signal Log_s transitions to the high level, the second latch 115 transitions the second latch signal L_s2 to the high level.

The first delay circuit 114 may have the same delay time as the delay times of the first logic 113 and the second latch 115.

The second logic 116 may be a component for generating the clock pulse P_clk in response to the delayed signal D_s and the second latch signal L_s2, where the delayed signal D_s is a signal which is acquired by delaying the first latch signal L_s1 by the delay times of the first logic 113 and the second latch 115. Therefore, actually, the second logic 116 may be considered a component for generating the clock pulse P_clk in response to the first latch signal L_s1 and the second latch signal L_s2.

Accordingly, the second logic 116 may generate the clock pulse P_clk having an enable period during which the clock pulse P_clk is enabled to the high level, corresponding to a time from when the first latch signal L_s1 transitions to the high level to when the second latch signal L_s2 transitions to the high level. As a result, the second logic 116 may generate the clock pulse P_clk which has the enable period the same as one cycle of the clock CLK.

Figure 6:
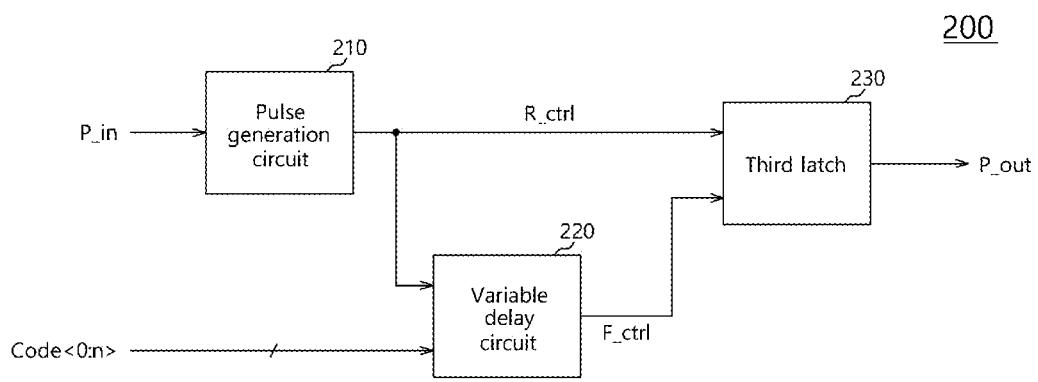
FIG. 6 is a configuration diagram illustrating a representation of an example of the pulse recovery circuit shown in FIG. 1.

As shown in FIG. 6, the pulse recovery circuit 200 may include a pulse generation circuit 210, a variable delay circuit 220, and a third latch 230.

The pulse generation circuit 210 may generate a rising control signal R_ctrl in response to the input pulse P_in. For example, the pulse generation circuit 210 generates the rising control signal R_ctrl which is enabled to a high level when the input pulse P_in is enabled to a specified level, that is, a high level. The rising control signal R_ctrl retains the enabled state for a predetermined time.

The variable delay circuit 220 may generate a falling control signal F_ctrl in response to the rising control signal R_ctrl and the codes Code<0:n>. For example, the variable delay circuit 220 may delay the rising control signal R_ctrl by a delay time corresponding to the code values of the codes Code<0:n>, and output the falling control signal F_ctrl.

The third latch 230 enables the output pulse P_out to a high level when the rising control signal R_ctrl is enabled to the high level, and retains the output pulse P_out which is enabled, until the falling control signal F_ctrl is enabled. Namely, the third latch 230 enables the output pulse P_out to the high level when the rising control signal R_ctrl is enabled to the high level, and disables the output pulse P_out to a low level when the falling control signal F_ctrl is enabled to a high level.

Therefore, the pulse recovery circuit 200 including the pulse generation circuit 210, the variable delay circuit 220, and the third latch 230 enables the output pulse P_out to the high level when the input pulse P_in is enabled to the high level, and the pulse recovery circuit 200 retains the enabled output pulse P_out for the time corresponding to the code value of the codes Code<0:n>. That is to say, the pulse recovery circuit 200 generates the output pulse P_out which is enabled at the same time as the input pulse P_in and has an enable period a length corresponding to the code value of the codes Code<0:n>.

Figure 7:
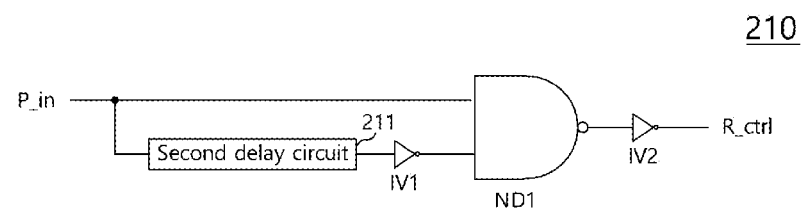
FIG. 7 is a configuration diagram illustrating a representation of an example of the pulse generation circuit shown in FIG. 6.

As shown in FIG. 7, the pulse generation circuit 210 may include a second delay circuit 211, first and second inverters IV1 and IV2, and a NAND gate ND1. The second delay circuit 211 receives, delays, and outputs the input pulse P_in. The first inverter IV1 is inputted with the output signal of the second delay circuit 211. The NAND gate ND1 is inputted with the input pulse P_in and the output signal of the first inverter IV1. The second inverter IV2 is inputted with the output signal of the NAND gate ND1, and outputs the rising control signal R_ctrl.

The signal recovery circuit in accordance with an embodiment, configured as mentioned above, operates as follows.

The enable signal EN_s is enabled.

The clock code generation circuit 100 generates the codes Code<0:n> having the code value corresponding to the predetermined cycle of the clock CLK, when the enable signal EN_s is enabled. For example, the clock code generation circuit 100 generates the codes Code<0:n> having the code value corresponding to one cycle of the clock CLK, when the enable signal EN_s is enabled.

The pulse recovery circuit 200 enables the output pulse P_out when the input pulse P_in is enabled, and retains the enabled state of the output pulse P_out to have the enable period of the length corresponding to the code value of the codes Code<0:n>.

A detailed operation of the clock code generation circuit 100 will be described below with reference to FIGS. 2 to 5.

As shown in FIG. 2, the clock code generation circuit 100 may include the clock pulse generation circuit 110, the oscillator 120, and the counting circuit 130.

The clock pulse generation circuit 110 may generate the clock pulse P_clk which has an enable period corresponding to one cycle of the clock CLK, for example, the enable period of the same length as one cycle of the clock CLK, when the enable signal EN_s is enabled.

The oscillator 120 may generate the oscillator signal OSC which transitions with the preselected cycle.

The counting circuit 130 may generate the codes Code<0: n> by counting the oscillator signal OSC during the enable period of the clock pulse P_clk.

Therefore, the clock code generation circuit 100 may generate the codes Code<0: n> having the code value corresponding to one cycle of the clock CLK.

The clock pulse generation circuit 110 will be described below with reference to FIGS. 3 to 5.

The dividing circuit 111 divides the clock CLK by 2 when the enable signal EN_s is enabled, and generates the divided clock CLK_dv.

The first latch 112 transitions the first latch signal L_s1 to the high level when the divided clock CLK_dv transitions to the high level when the enable signal EN_s is enabled, and disables the first latch signal L_s1 to the low level when the enable signal EN_s is disabled.

The first logic 113 inverts the divided clock CLK_dv when the first latch signal L_s1 is enabled, and the first logic 113 outputs the logic signal Log_s. Thus, the divided clock CLK_dv and the logic signal Log_s have a phase difference corresponding to one half cycle of the divided clock CLK_dv.

The second latch 115 transitions the second latch signal L_s2 to the high level when the logic signal Log_s transitions to the high level, and disables the second latch signal L_s2 to the low level when the enable signal EN_s is disabled.

The first delay circuit 114 has the same delay time as the actual delay times of the first logic 113 and the second latch 115.

Hence, the second logic 116 may generate the clock pulse P_clk which has an enable period corresponding to the time from when the first latch signal L_s1 is enabled to when the second latch signal L_s2 is enabled, that is, the enable period corresponding to one half cycle of the divided clock CLK_dv, or one cycle of the clock CLK.

In this way, the clock pulse generation circuit 110 may generate the clock pulse P_clk which has an enable period of the same length as one cycle of the clock CLK, and the codes Code<0:n> are generated by counting the oscillator signal OSC during the enable period of the clock pulse P_clk through using the oscillator 120 and the counting circuit 130. As a consequence, the clock code generation circuit 100 may generate codes Code<0:n> which have a code value corresponding to one cycle of the clock CLK, when the enable signal EN_s is enabled.

The detailed operation of the pulse recovery circuit 200 will be described below with reference to FIG. 6.

The pulse generation circuit 210 generates a rising control signal R_ctrl which is enabled during a predetermined time, when the input pulse P_in is enabled to the high level.

The variable delay circuit 220 delays the rising control signal R_ctrl for a delay time corresponding to the codes Code<0:n>, and generates the falling control signal F_ctrl.

The third latch 230 enables the output pulse P_out when the rising control signal R_ctrl is enabled, and disables the output pulse P_out when the falling control signal F_ctrl is enabled.

Thus, the pulse recovery circuit 200 may generate the output pulse P_out which is enabled when the input pulse P_in is inputted and has the enable period corresponding to the codes Code<0:n>.

As is apparent from the above descriptions, the signal recovery circuit according to an embodiment may determine the length of an enable period in response to the cycle or frequency of a clock, and generate an output signal or an output pulse having the enable period of a determined length, when an input signal or an input pulse is inputted.

While various embodiments have been described above, it will be understood to those skilled in the art that the embodiments described are examples only. Accordingly, the signal recovery circuit described herein should not be limited based on the described embodiments.

Figure 8:
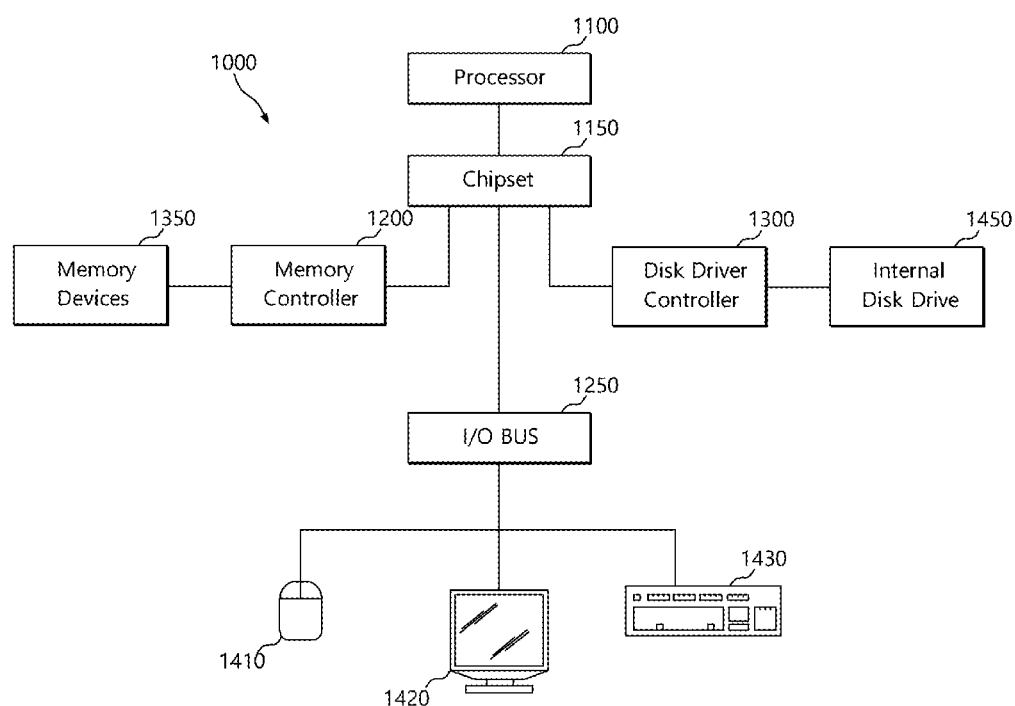
FIG. 8 illustrates a block diagram of an example representation of a system employing a semiconductor device in accordance with the various embodiments discussed above with relation to FIGS. 1-7.

The semiconductor devices and/or a signal recovery circuit discussed above (see FIGS. 1-7) are particularly useful in the design of memory devices, processors, and computer systems. For example, referring to FIG. 8, a block diagram of a system employing a semiconductor device and/or a signal recovery circuit in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and/or a signal recovery circuit as discussed above with reference to FIGS. 1-7. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or a signal recovery circuit as discussed above with relation to FIGS. 1-7, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 8 is merely one example of a system 1000 employing a semiconductor device and/or a signal recovery circuit as discussed above with relation to FIGS. 1-7. In alternate embodiments, such as, for example but not limited to, cellular phones or digital cameras, the components may differ from the embodiments illustrated in FIG. 8.

What is claimed is:

1. A signal recovery circuit comprising:
a clock code generation circuit configured to generate codes having a code value, the code value determined by a predetermined pulse of a divided clock in response to an enable signal and a clock, the divided clock being derived from the clock;
a pulse recovery circuit configured to generate an output pulse in response to an input pulse and the codes,
wherein the clock code generation circuit comprises:
a clock pulse generation circuit configured to generate a clock pulse which has an enable period of a length corresponding to the predetermined cycle of the clock, when the enable signal is enabled;
an oscillator configured to generate an oscillator signal; and
a counting circuit configured to generate the codes by counting the oscillator signal during the enable period of the clock pulse.

2. The signal recovery circuit according to claim 1, wherein the clock code generation circuit generates the codes which have a code value corresponding to a predetermined cycle of the clock, when the enable signal is enabled.

3. The signal recovery circuit according to claim 2, wherein the clock code generation circuit generates the codes which have a code value corresponding to one cycle of the clock, when the enable signal is enabled.

4. The signal recovery circuit according to claim 1, wherein the clock pulse generation circuit comprises:
a dividing circuit configured to divide the clock when the enable signal is enabled, and generate the divided clock;
a first latch configured to enable a first latch signal until the enable signal is disabled, if the divided clock transitions to a specified level in a state in which the enable signal is enabled;
a first logic configured to generate a logic signal in response to the divided clock and the first latch signal;
a second latch configured to enable a second latch signal until the enable signal is disabled, if the logic signal transitions to a specified level in a state in which the enable signal is enabled;
a delay circuit configured to delay the first latch signal and output a delayed signal; and
a second logic configured to generate the clock pulse in response to the delayed signal and the second latch signal.

5. The signal recovery circuit according to claim 4, wherein the first logic generates the logic signal having a low level when the divided clock and the first latch signal are the same level, and generates the logic signal having a high level when the divided clock and the first latch signal are different levels.

6. The signal recovery circuit according to claim 4, wherein the first logic inverts the divided clock when the first latch signal is enabled, and outputs the logic signal.

7. The signal recovery circuit according to claim 4, wherein the delay circuit has the same delay time as a sum of delay times of the first logic and the second latch.

8. The signal recovery circuit according to claim 4, wherein the second logic generates the clock pulse having a low level when the delayed signal and the second latch signal are the same level, and generates the clock pulse having a high level when the delayed signal and the second latch signal are different levels.

9. The signal recovery circuit according to claim 1, wherein the pulse recovery circuit comprises:
a pulse generation circuit configured to generate a rising control signal which is enabled for a predetermined time, when the input pulse is enabled;
a variable delay circuit configured to delay the rising control signal by a delay time corresponding to the code value of the codes, and generate a falling control signal; and
a latch configured to enable the output pulse when the rising control signal is enabled, and disable the output pulse when the falling control signal is enabled.

10. A signal recovery circuit comprising:
a clock code generation circuit configured to generate codes which have a code value, the code value determined by a predetermined pulse of a divided clock, when an enable signal is enabled, the divided clock being derived from a clock;
a pulse recovery circuit configured to enable an output pulse when an input pulse is inputted, and generate the output pulse which has an enable period corresponding to the code value of the codes,
wherein the clock code generation circuit comprises:
a clock pulse generation circuit configured to generate a clock pulse which has an enable period corresponding to the predetermined cycle of the clock, when the enable signal is enabled;
an oscillator configured to generate an oscillator signal which transitions with a preselected cycle; and
a counting circuit configured to generate the codes by counting the oscillator signal during the enable period of the clock pulse.

11. The signal recovery circuit according to claim 10, wherein the clock pulse generation circuit generates the clock pulse with an enable period the same length as a predetermined cycle of the clock.

12. The signal recovery circuit according to claim 10, wherein the counting circuit is configured to increase the code value of the codes each time the oscillator signal transitions to a specified level during the enable period of the clock pulse.

13. The signal recovery circuit according to claim 10, wherein the pulse recovery circuit comprises:
a pulse generation circuit configured to generate a rising control signal when the input pulse is enabled;
a variable delay circuit configured to delay the rising control signal by a delay time corresponding to the code value of the codes, and generate a falling control signal; and
a latch configured to enable the output pulse in response to the rising control signal, and disable the output pulse in response to the falling control signal.

14. The signal recovery circuit according to claim 13, wherein the variable delay circuit generates the falling control signal in response to the rising control signal and the codes.

15. The signal recovery circuit according to claim 13, wherein the latch retains the enabled output pulse until the falling control signal is enabled.

16. The signal recovery circuit according to claim 13, wherein the latch enables the output pulse when the rising control signal is enabled, and disables the output pulse when falling control signal is enabled.

17. The signal recovery circuit according to claim 13, wherein the pulse generation circuit comprises:
a delay circuit configured to receive, delay, and output the input pulse;
a first inverter configured to be inputted with an output signal of the delay circuit;
a gate configured to receive the input pulse and the output of the first inverter and output an output signal; and
a second inverter configured to receive the output signal outputted from the gate and output the rising control signal.

18. The signal recovery circuit according to claim 10, wherein the pulse recovery circuit is configured to generate the output pulse which is enabled at the same time as the input pulse.

* * * * *